United States Patent
Ho

(10) Patent No.: US 7,489,579 B2
(45) Date of Patent: Feb. 10, 2009

(54) DEVICE AND METHOD FOR CONTROLLING REFRESH RATE OF MEMORY

(75) Inventor: Kuan-Jui Ho, Taipei (TW)

(73) Assignee: Via Technologies, Inc., Taipei (TW)

( * ) Notice: Subject to any disclaimer, the term of this patent is extended or adjusted under 35 U.S.C. 154(b) by 268 days.

(21) Appl. No.: 11/425,653

(22) Filed: Jun. 21, 2006

(65) Prior Publication Data

US 2007/0171751 A1 Jul. 26, 2007

(30) Foreign Application Priority Data

Jan. 25, 2006 (TW) .............................. 95102920 A

(51) Int. Cl.
*G11C 7/00* (2006.01)
(52) U.S. Cl. ..................... 365/222; 365/51; 365/52; 365/189.2; 365/211
(58) Field of Classification Search ............... 365/126, 365/221, 212, 222, 51, 52, 189.2, 211; 713/1–2, 713/320
See application file for complete search history.

(56) References Cited

U.S. PATENT DOCUMENTS

| | | | |
|---|---|---|---|
| 5,596,532 A * | 1/1997 | Cernea et al. | 365/185.18 |
| 5,621,685 A * | 4/1997 | Cernea et al. | 365/185.18 |
| 6,983,378 B1 * | 1/2006 | Kokubo | 726/26 |
| 7,370,186 B1 * | 5/2008 | Lilliebjerg | 713/1 |
| 2006/0018160 A1 * | 1/2006 | Moogat et al. | 365/185.18 |
| 2006/0112292 A1 * | 5/2006 | Lin et al. | 713/320 |
| 2006/0129789 A1 * | 6/2006 | Chu et al. | 713/1 |

FOREIGN PATENT DOCUMENTS

WO WO2004/095465 11/2004

* cited by examiner

*Primary Examiner*—Pho M. Luu
(74) *Attorney, Agent, or Firm*—Kirton & McConkie; Evan R. Witt

(57) ABSTRACT

A control device and method are used for adjusting the refresh rate of a memory module in a computer system. The device includes a thermo sensor and a control circuit. In the control method, the thermo sensor actively outputs a temperature change signal in response to the temperature change in the memory module when a capacitor of the memory module incurs an aggravated current leakage due to the temperature rise. Next, the control circuit adjusts the refresh rate in response to the temperature change signal and refreshes the memory module at the refresh rate.

19 Claims, 4 Drawing Sheets

DEVICE AND METHOD FOR CONTROLLING REFRESH RATE OF MEMORY

FIELD OF THE INVENTION

The present invention generally relates to a device and method for controlling the refresh rate of a memory module, and in particular relates to a control method and device for controlling the refresh rate of a memory module in a computer system.

BACKGROUND OF THE INVENTION

Please refer to FIG. 1, which depicts a circuit diagram of a memory unit in a dynamic random access memory (DRAM) module. The memory unit includes a transistor 11 and a capacitor 12. The capacitor 12 is fully charged if the data value stored in the memory unit is 1, and the capacitor 12 is discharged if the data value is 0. The electric charges accumulated in the capacitor 12 will be progressively lost while reading data. Moreover, charge loss of the capacitor 12 occurs after a period of time despite no access. Therefore, the charge should be refreshed several times in a second. Generally speaking, the entire DRAM module should be refreshed once about every 64 ms to keep the data accurate.

Please refer now to FIG. 2, which depicts a functional block diagram of a conventional computer system. The conventional computer system includes a central processing unit (CPU) 20, a Northbridge chip 21, a Southbridge chip 22 and a DRAM module 23 connected to the Northbridge chip 21 via a bus 210. Nowadays, most computer systems enter a suspend mode in which the CPU 20 stores some necessary data to the DRAM module 23 through the bus 210 after the computer system idles for a period of time. Then the CPU 20, the Northbridge chip 21 and the Southbridge chip 22 are all powered down while only the DRAM module 23 remains powered on, which is called as "suspend to RAM." Meanwhile, since all other chips are powered down, the DRAM module 23 has to refresh data by using a clock generator (not shown) of its own, i.e. self-refresh.

The leakage current of the capacitor varies with temperature, for example, high temperature results in increased leakage current, which may cause data error since a great deal of charges in the capacitor are lost before the data are refreshed. Therefore, a thermo sensor (not shown) is integrated into the electrically erasable programmable read only memory (EEPROM) 230 of the DRAM module 23 to monitor the temperature in the DRAM module 23 any time. When the computer system has entered a power-saving mode to have all the other chips powered down, the DRAM module 23 can still react to the temperature change. For example, the self-refresh rate is increased in response to the rise in temperature to avoid data error, and the self-refresh rate is decreased in response to the drop in temperature to effectively reduce power consumption. In the prior art, no method has ever provided for effectively adjusting the refresh rate of the DRAM module 23 according to the temperature change when the computer system is in a normal mode. Hence, data error probably occurs in the DRAM module 23 when working in the normal mode. For this reason, the present invention is provided to overcome such disadvantage of the prior art.

SUMMARY OF THE INVENTION

A control device for adjusting the refresh rate of a memory module in a computer system is provided. The control device includes a thermo sensor integrated into the memory module for actively outputting a temperature change signal in response to the temperature change in the memory module. The control device also includes a control circuit electrically connected to the memory module and the thermo sensor for refreshing the memory module at a preset refresh rate. The preset refresh rate can be adjusted in response to the temperature change signal outputted by the thermo sensor.

Moreover, a control device for adjusting the refresh rate of a DRAM module in a computer system is also provided. The control device includes a thermo sensor integrated into the DRAM module for actively outputting a temperature change signal when a capacitor of the DRAM incurs aggravated leakage current due to the rise in temperature. The control device also includes a control circuit electrically connected to the DRAM module and the thermo sensor for refreshing the DRAM module at a preset refresh rate. The preset refresh rate can be adjusted in response to the temperature change signal outputted by the thermo sensor.

Further, a control method applied to a computer system for controlling the refresh rate of a memory module is also provided. The computer system includes a DRAM module and a control circuit. A thermo sensor is integrated into the DRAM module and the control circuit is disposed in a chipset. The control method includes steps of: actively outputting a temperature change signal by the thermo sensor in response to the temperature rise of the DRAM module when a capacitor of the memory module incurs the leakage current due to the temperature rise; and refresh the DRAM module once every refresh period by the control circuit in response to the temperature change signal. The refresh period is shortened when the temperature change signal indicates the temperature rise.

Other objects, features, and advantages of the invention will become apparent from the following detailed description of the preferred but non-limiting embodiments. The following description is made with reference to the accompanying drawings.

BRIEF DESCRIPTION OF THE DRAWINGS

The accompanying drawings are incorporated into and form a part of the specification for the purpose of explaining the principles of the invention. The drawings are not to be constructed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE PREFERRED EMBODIMENT

The illustrative embodiments of the present invention will be described with reference to the figure drawings wherein like elements and structures are indicated by like reference numbers.

Figure 1:
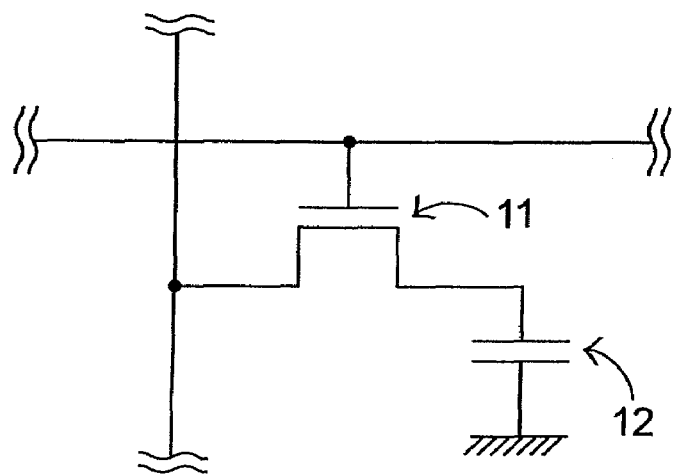
FIG. 1 is a circuit diagram of a memory unit in a DRAM module.
Figure 2:
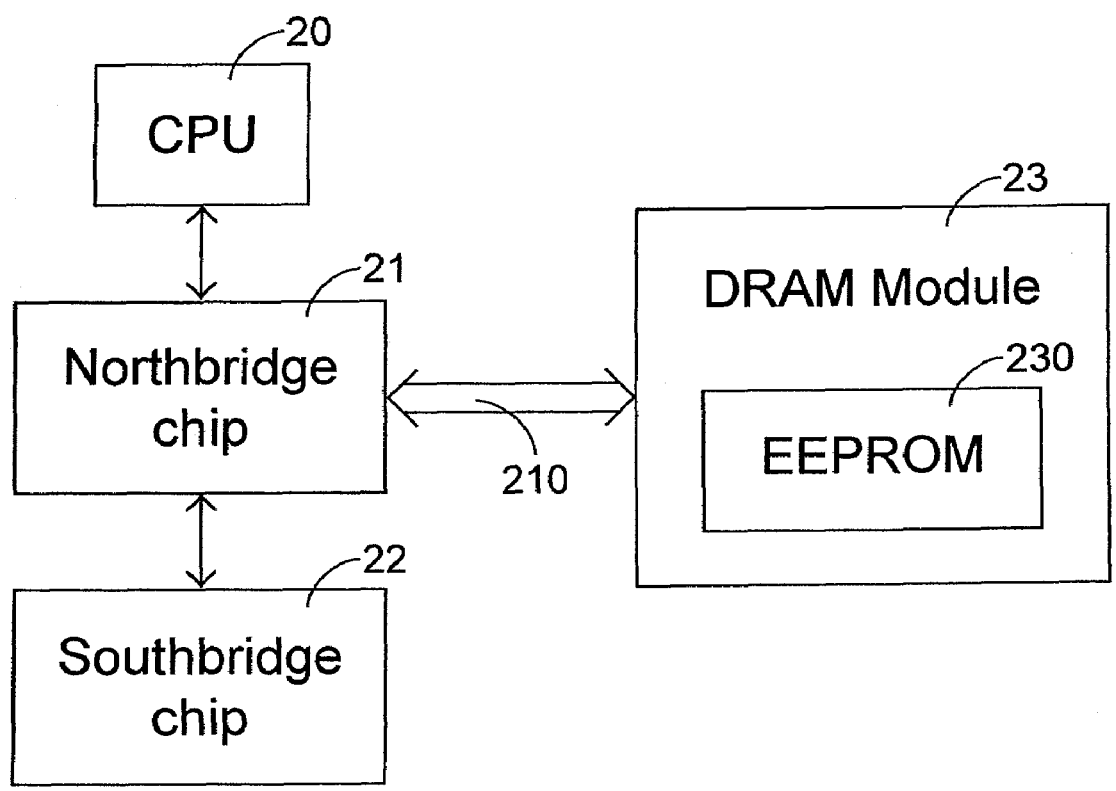
FIG. 2 is a functional block diagram of a traditional computer system.
Figure 3:
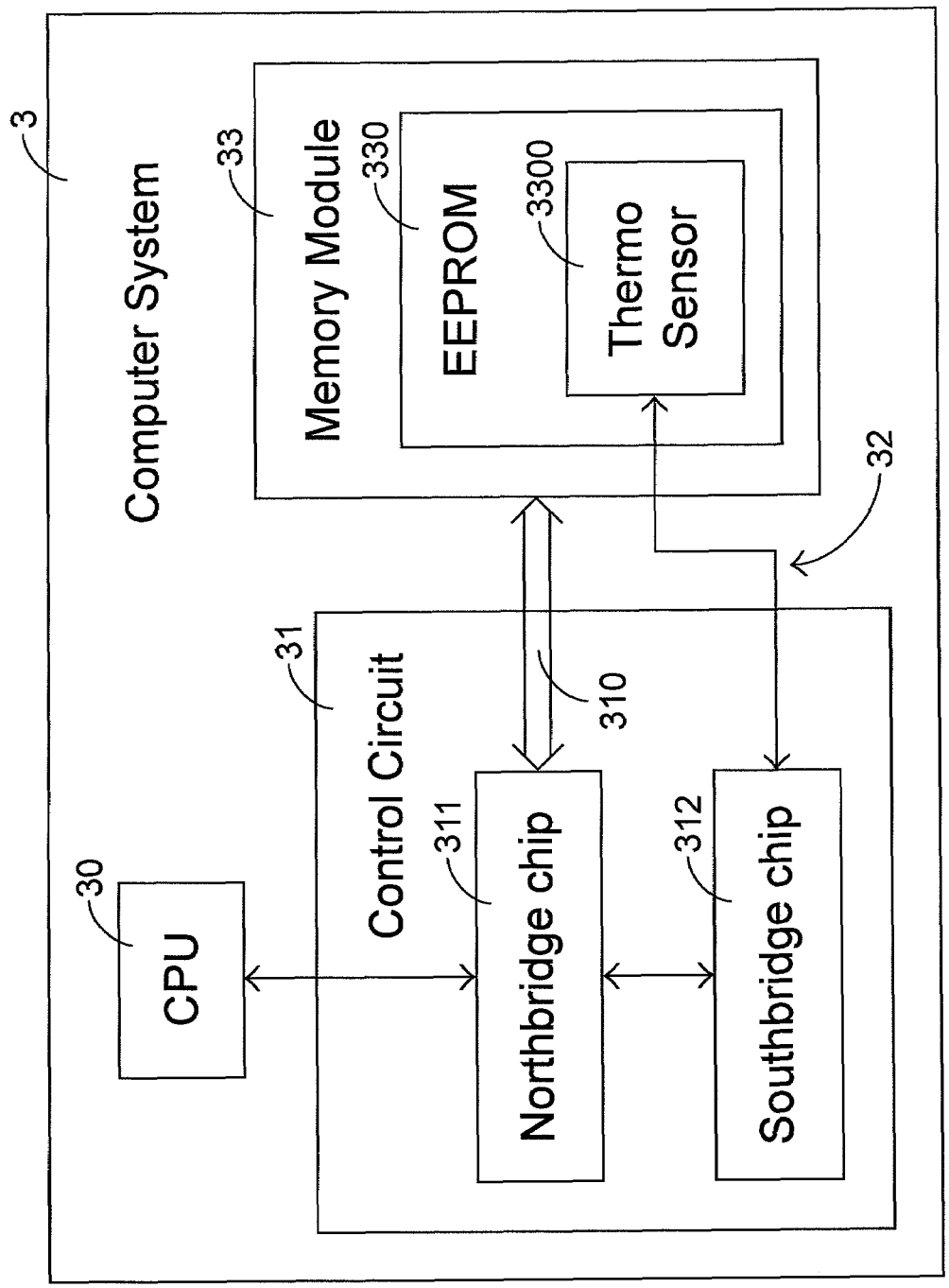
FIG. 3 is a functional block diagram showing an embodiment of a control device for adjusting the refresh rate of a memory in a computer system according to the present invention.

Please refer to FIG. 3, which depicts a functional block diagram showing an embodiment of a control device for adjusting the refresh rate of a memory module according to the present invention. The control device is provided for improving the prior art and applied to a computer system 3, which includes a memory module 33 and a CPU 30. The control device includes a thermo sensor 3300 and a control circuit 31. In an embodiment, the memory module 33 can be a DRAM module in the form of a Dual Inline Memory Module (DIMM), and the thermo sensor 3300 is integrated into an EEPROM 330 of the memory module 33 for actively outputting a temperature change signal in response to the temperature change in the memory module 33.

In detail, when the computer system 3 is operated in the normal mode with rising temperature in the memory module 33 due to cooling inefficiency, for instance, the cooling fan has a breakdown, the thermo sensor 3300 actively outputs a temperature up signal to inform the control circuit 31, separate from the memory module 33, that the memory module 33 is overheating. On the other hand, the thermo sensor 3300 actively outputs a temperature down signal to the control circuit 31 if the temperature in the memory module 33 decreases. The thermo sensor 3300 is integrated into the EEPROM 330, and the EEPROM 330 is connected to the Southbridge chip 312 in the control circuit 331 via a system management bus (SMBus) 32. In this embodiment, the EEPROM 330 should serve as a master device on the SMBus 32 so that the thermo sensor 3300 is able to output signals actively.

Accordingly, the Southbridge chip 312 in the control circuit 31 receives a temperature change signal from the EEPROM 330 via the SMBus 32 when the computer system 3 operates in the normal mode. In response to the temperature change signal, the Southbridge chip 312 in the control circuit 31 outputs a period change signal to the Northbridge chip 311 to make the Northbridge chip 311 change the refresh period in response to the period change signal outputted by the Southbridge chip 312. Moreover, the Northbridge chip 311 in the normal mode refreshes the memory module 33 once every refresh period in accordance with the control signal transmitted via the DRAM bus 310.

In other words, the Northbridge chip 311 shortens the refresh period when the temperature in the memory module 33 increases and lengthens the refresh period when the temperature of the memory module 33 decreases. That is to say, the Northbridge chip 311 speeds/slows the refresh rate in response to the rise/drop of the temperature in the memory module 33. As a result, even if the computer system 3 is not in the power-saving mode, the refresh rate of data can be adjusted according to the temperature change in the memory module 33 to effectively avoid data error. Furthermore, the present control device takes advantage of the thermo sensor 3300 that already exists in the conventional architecture rather than using an operating system or software as the control means. In this way, the disadvantage of the prior art can be improved and the object of the present invention can be achieved.

Figure 4:
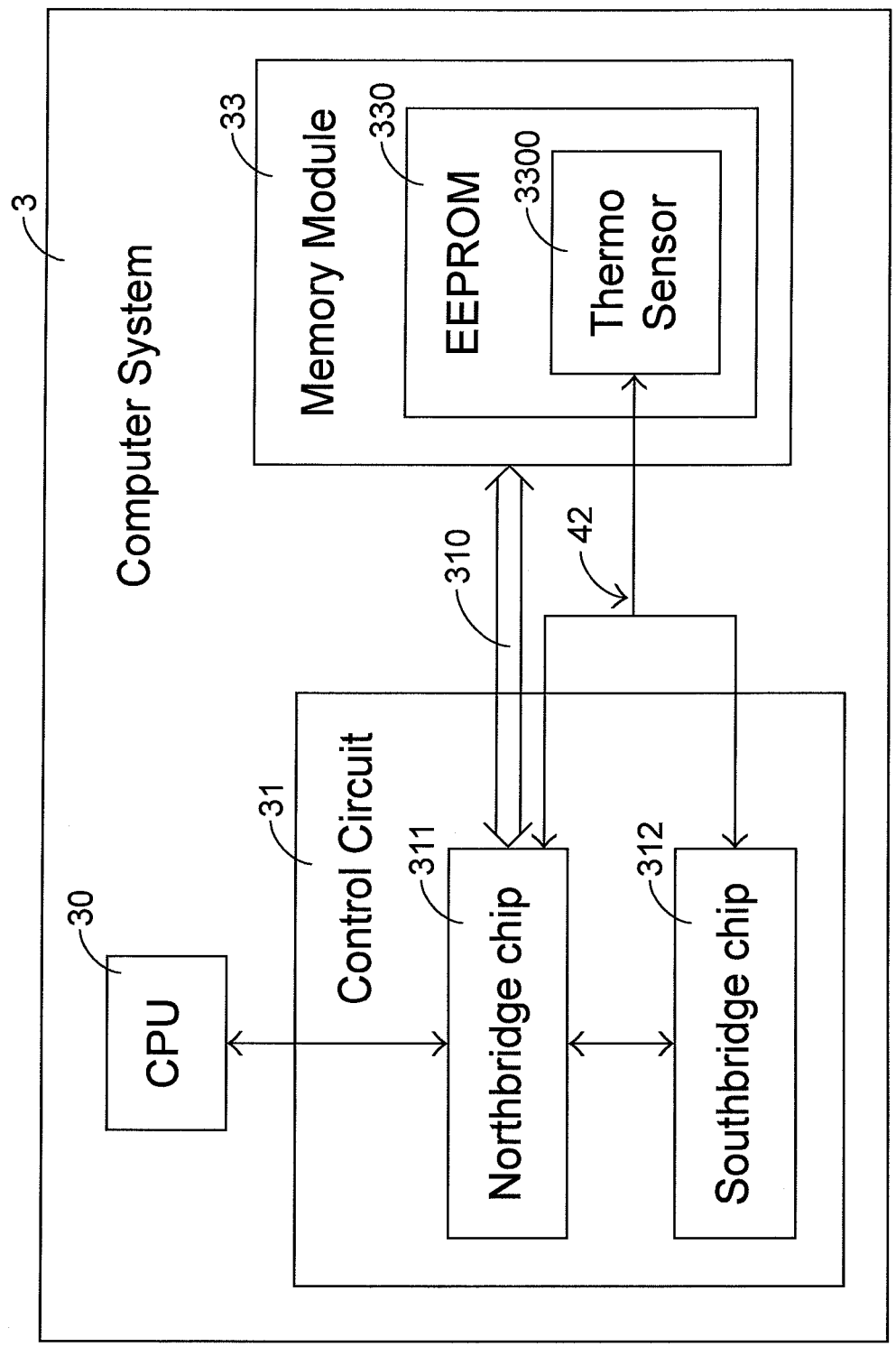
FIG. 4 is a functional block diagram showing another embodiment of a control device for adjusting the refresh rate of a memory in a computer system according to the present invention.

Please refer to FIG. 4 which depicts a functional block diagram of another embodiment of a control device for adjusting the refresh rate of a memory according to the present invention. The control device is provided for improving the prior art and applied to a computer system 3, which includes a memory module 33 and a CPU 30. The control device includes a thermo sensor 3300 and a control circuit 31. In an embodiment, the memory module 33 can be a DIMM and the thermo sensor 3300 is integrated into the EEPROM 330 of the memory module 33 for actively outputting a temperature change signal in response to the temperature change in the memory module 33.

Similarly, the thermo sensor 3300 actively outputs a temperature up signal when the temperature in the memory module 33 increases and actively outputs a temperature down signal when the temperature in the memory module 33 decreases. The thermo sensor 3300 can be integrated into the EEPROM 330. In this embodiment, the thermo sensor 3300 is connected to the Northbridge chip 311 and the Southbridge chip 312, both of which are integrated into a chipset, via the SMBus 42. The EEPROM 330 should serve as a master device on the SMBus 42 so as to actively output signals. Unlike the embodiment shown in FIG. 3, in which the EEPROM 330 is connected to the Southbridge chip 312 only, the EEPROM 330 in FIG. 4 is connected to both the Northbridge chip 311 and the Southbridge chip 312.

As a result, in the normal mode, the Northbridge chip 311 in the control circuit 31 may directly receive a temperature change signal actively transmitted from the EEPROM 330 via the SMBus 42 rather than through other unit such as the Southbridge chip 312. Therefore, the Northbridge chip 311 can directly change the refresh rate of the memory module 33 in response to the temperature change signal. Moreover, the Northbridge chip 311 operating in the normal mode outputs control signals at the refresh rate via the DRAM bus 310, thereby refreshing the memory module 33. Therefore, when the temperature in the memory module 33 rises, the Northbridge chip 311, separate from the memory module 33, can be informed of the rise in temperature and increase the refresh rate of the memory module 33. On the contrary, the Northbridge chip 311 will control the memory module 33 to slow the refresh rate when the temperature in the memory module 33 decreases. The present control device can actively adjust the refresh rate of the memory module 33 in response to the temperature change in the normal mode, rather than controlling the refresh rate by an operating system or software. The refresh rate of data can be adjusted or controlled by the control circuit 31 to effectively avoid data error in the normal mode.

Figure 5:
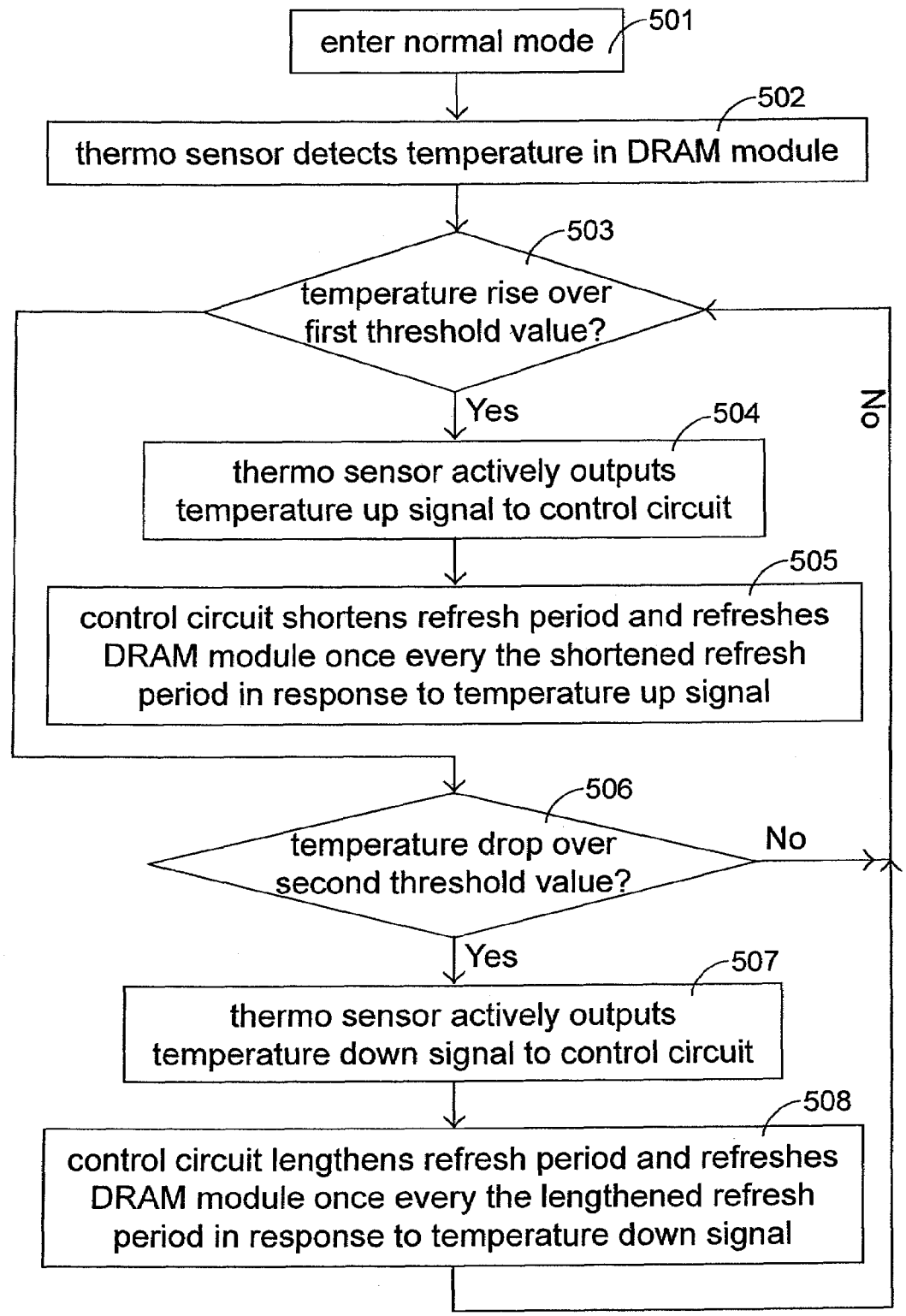
FIG. 5 is a flowchart illustrating an embodiment of a method for controlling the refresh rate of a memory according to the present invention.

Turning now to FIG. 5, a flowchart is shown to illustrate an embodiment of the present invention. First in step 501, the computer system enters a normal mode. Followed by step 502, the thermo sensor detects the temperature in the DRAM module. In step 503, if the temperature rises over a first threshold value which has been preset before the running of the computer system, the thermo sensor actively outputs a temperature up signal to the control circuit in step 504. And then in step 505, the control circuit refreshes the DRAM module once every refresh period. In this condition, the refresh period is shortened, that is, the refresh rate increases in response to the temperature up signal. Otherwise, if the temperature doesn't rise over the first threshold value, another decision is made in step 506. If the temperature drops over a second threshold value, the thermo sensor actively outputs a temperature down signal to the control circuit in step 507. And then in step 508, the control circuit lengthens the refreshes period to refresh the DRAM module. That is, the refresh rate decreases in response to the temperature down signal to save power consumption.

As mentioned above, the disadvantage of the prior art can be improved and the object of the present invention can be achieved. While the invention has been described with respect to the physical embodiments constructed in accordance therewith, it will be apparent to those skilled in the art that various modifications, variations and improvements of the present invention may be made in light of the above teachings and within the purview of the appended claims without departing from the spirit and intended scope of the invention. In addition, those areas, in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A control device for adjusting a refresh rate of a memory module in a computer system, comprising:

a thermo sensor integrated into the memory module for actively outputting a temperature change signal in response to the temperature change in the memory module; and a control circuit electrically connected to the memory module and said thermo sensor for adjusting a refresh period for refreshing the memory module in response to the temperature change signal.

2. The control device of claim 1, wherein said thermo sensor is integrated into an electrically erasable programmable read only memory (EEPROM) and said EEPROM is connected to said control circuit via a system management bus (SMBus) and presented as a master device on said SMBus.

3. The control device of claim 1, wherein said control circuit shortens the refresh period when the temperature change signal outputted actively by said thermo sensor is a temperature up signal, and lengthens the refresh period when the temperature change signal outputted actively by said thermo sensor is a temperature down signal.

4. The control device of claim 1, said control circuit further comprising:
   a Southbridge chip electrically connected to said thermo sensor for outputting a period change signal in response to the temperature change signal; and
   a Northbridge chip electrically connected to said Southbridge chip and the memory module for refreshing the memory module once every the refresh period and adjusting the refresh period in response to the period change signal.

5. The control device of claim 1, said control circuit further comprising a Northbridge chip electrically connected to said thermo sensor and the memory module for refreshing the memory module once every the refresh period and adjusting the refresh period in response to the temperature change signal.

6. The control device of claim 1, wherein the memory module in the computer system is a Dual Inline Memory Module (DIMM).

7. The control device of claim 1, wherein said control circuit, operating in a normal mode, refreshes the memory module once every the refresh period adjusted in response to the temperature change signal outputted actively by said thermo sensor.

8. A control apparatus, for adjusting a refresh rate of a dynamic random access memory (DRAM) module in a computer system, comprising:
   a thermo sensor integrated into the DRAM module for actively outputting a temperature change signal when a capacitor of the DRAM module incurs leakage current due to the temperature change; and
   a control circuit electrically connected to the DRAM module and said thermo sensor for adjusting a refresh period for refreshing the DRAM module in response to the temperature change signal.

9. The control device of claim 8, wherein said thermo sensor is connected to said control circuit via a SMBus.

10. The control device of claim 8, wherein said control circuit shortens the refresh period when the temperature change signal outputted actively by said thermo sensor is a temperature up signal, and lengthens the refresh period when the temperature change signal outputted actively by said thermo sensor is a temperature down signal.

11. The control device of claim 8, said control circuit further comprising:
   a Southbridge chip electrically connected to said thermo sensor for outputting a period change signal in response to the temperature change signal; and
   a Northbridge chip electrically connected to said Southbridge chip and the DRAM module for refreshing the DRAM module once every the refresh period and adjusting the refresh period in response to the period change signal.

12. The control device of claim 8, said control circuit further comprising a Northbridge chip electrically connected to said thermo sensor and the DRAM module for refreshing the DRAM module once every the refresh period and adjusting the refresh period in response to the temperature change signal.

13. The control device of claim 8, wherein the DRAM module in the computer system is a DIMM.

14. The control device of claim 8, wherein said control circuit, operating in a normal mode, refreshes the DRAM module once every the refresh period adjusted in response to the temperature change signal outputted actively by said thermo sensor.

15. A control method for adjusting a refresh rate of a memory in a computer system, said computer system comprising a DRAM module, a thermo sensor integrated into the DRAM module and a control circuit disposed in a chipset; the control method comprising steps of:
   the thermo sensor actively outputting a temperature change signal when a capacitor of the DRAM module incurs leakage current due to the temperature change; and
   the control circuit refreshing the DRAM module once every refresh period which is adjusted in response to the temperature change signal.

16. The control method of claim 15, wherein the refresh period is shortened when the temperature change signal is a temperature up signal, and the refresh period is lengthened when the temperature change is a temperature down signal.

17. The control method of claim 15, wherein the control circuit receives the temperature change signal via a SMBus.

18. The control method of claim 17, wherein the chipset comprises:
   a Southbridge chip for receiving the temperature change signal actively transmitted by the thermo sensor via the SMBus; and
   a Northbridge chip for adjusting the refresh period for refreshing the DRAM module in response to the temperature change signal.

19. The control method of claim 17, wherein the chipset comprises a Northbridge chip for receives the temperature change signal transmitted actively by the thermo sensor via the SMBus and adjusting the refresh period for refreshing the DRAM module in response to the temperature change signal.

* * * * *